(12) United States Patent
Yamamoto et al.

(10) Patent No.: US 12,489,409 B2
(45) Date of Patent: Dec. 2, 2025

(54) POWER AMPLIFIER

(71) Applicant: Mitsubishi Electric Corporation, Tokyo (JP)

(72) Inventors: Kazuya Yamamoto, Tokyo (JP); Satoshi Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 286 days.

(21) Appl. No.: 18/249,197

(22) PCT Filed: Mar. 3, 2021

(86) PCT No.: PCT/JP2021/008271
§ 371 (c)(1),
(2) Date: Apr. 14, 2023

(87) PCT Pub. No.: WO2022/185459
PCT Pub. Date: Sep. 9, 2022

(65) Prior Publication Data
US 2024/0030879 A1  Jan. 25, 2024

(51) Int. Cl.
*H03F 1/07* (2006.01)
*H03F 1/02* (2006.01)
*H03F 1/08* (2006.01)
*H03F 1/30* (2006.01)
*H03F 3/24* (2006.01)

(52) U.S. Cl.
CPC ........... *H03F 3/245* (2013.01); *H03F 1/0216* (2013.01); *H03F 1/086* (2013.01); *H03F 1/301* (2013.01); *H03F 2200/451* (2013.01)

(58) Field of Classification Search
CPC .............. H03F 1/07; H03F 3/191; H03G 3/20

USPC ................. 330/295, 302, 129, 136
See application file for complete search history.

(56) References Cited

U.S. PATENT DOCUMENTS

2011/0050345 A1  3/2011 Quack et al.
2014/0353674 A1  12/2014 Kinoshita et al.

FOREIGN PATENT DOCUMENTS

JP  2013-503555 A  1/2013
JP  2014-232805 A  12/2014

OTHER PUBLICATIONS

International Search Report issued in PCT/JP2021/008271; mailed Jun. 1, 2021.

(Continued)

*Primary Examiner* — Henry Choe
(74) *Attorney, Agent, or Firm* — Studebaker Brackett PLLC

(57) ABSTRACT

A power amplifier includes a main transistor configured to amplify an input signal and having characteristics of a drain current delay, a replica transistor having the same characteristics of the drain current delay as the characteristics of the main transistor, a temperature of the replica transistor changing in accordance with a temperature of the main transistor, and an envelope signal of the input signal being input to the replica transistor, an extraction circuit configured to extract a delay component due to the drain current delay from an output voltage of the replica transistor and an adder configured to add the delay component to a gate bias voltage to be applied to the main transistor so as to cancel out the drain current delay of the main transistor.

14 Claims, 20 Drawing Sheets

(56) References Cited

OTHER PUBLICATIONS

Pedro M. Tomé, et al., A Multiple-Time-Scale Analog Circuit for the Compensation of Long-Term Memory Effects in GaN HEMT-Based Power Amplifiers, IEEE Transactions on Microwave Theory and Techniques, vol. 68, No. 9, pp. 3709-3723, Sep. 2, 2020.

Pedro M. Tomé, et al., Hybrid Analog/Digital Linearization of GaN HEMT-Based Power Amplifiers, IEEE Transactions on Microwave Theory and Techniques, vol. 67, No. 1, pp. 288-294, Jan. 4, 2019.

POWER AMPLIFIER

FIELD

The present disclosure relates to a power amplifier.

BACKGROUND

In GaN transistors, a phenomenon is sometimes observed that a delay occurs until a drain current at the time that a radio frequency (RF) pulse is turned off is recovered to a value before application of the RF pulse. NPL 1 discloses a circuit that compensates for such a drain current delay.

CITATION LIST

Patent Literature

[NPL 1] "A Multiple-Time-Scale Analog Circuit for the Compensation of Long-Term Memory Effects in GaN HEMT-Based Power Amplifiers", IEEE Transactions on Microwave Theory and Techniques, vol. 68, no. 9, pp. 3709 to 3723, September 2020

SUMMARY

Technical Problem

Typically, a time constant of a drain current delay changes in accordance with a temperature. It is difficult to simulate a time constant depending on a temperature change of a GaN transistor with a circuit disclosed in NPL 1. For example, in a case where a resistance value is changed with respect to a temperature, a variable resistor is required. Further, there can be a case where an auxiliary circuit that applies an appropriate voltage to the variable resistor in accordance with a temperature change is required. Thus, there is a possibility that a device becomes larger.

An object of the present disclosure is to provide a power amplifier that can be made smaller.

Solution to Problem

A power amplifier according to the present disclosure includes a main transistor configured to amplify an input signal input from a gate terminal and output the amplified input signal from a drain terminal and having such characteristics of a drain current delay that, if a state of the input signal is switched from an ON state to an OFF state, after a drain current becomes lower than a reference value before the input signal is put into the ON state, the drain current returns to the reference value, a replica transistor having the same characteristics of the drain current delay as the characteristics of the drain current delay of the main transistor, a temperature of the replica transistor changing in accordance with a temperature of the main transistor, and an envelope signal of the input signal being input to a gate terminal of the replica transistor, an extraction circuit configured to extract a delay component due to the drain current delay from an output voltage of the replica transistor and an adder configured to add the delay component to a gate bias voltage to be applied to the main transistor so as to cancel out the drain current delay of the main transistor.

Advantageous Effects of Invention

In a power amplifier according to the present disclosure, a delay component due to a drain current delay is extracted from a replica transistor which has the same characteristics of a drain current delay as those of a main transistor and whose temperature changes in accordance with a temperature of the main transistor. Use of this delay component enables compensation for the drain current delay of the main transistor in accordance with a temperature change. It is therefore possible to make the power amplifier smaller than in a case where a variable resistor and an auxiliary circuit are used.

BRIEF DESCRIPTION OF DRAWINGS

FIG. 15B is a view illustrating a vector error in a case where the drain current delay is not compensated for.

DESCRIPTION OF EMBODIMENTS

Figure 1:
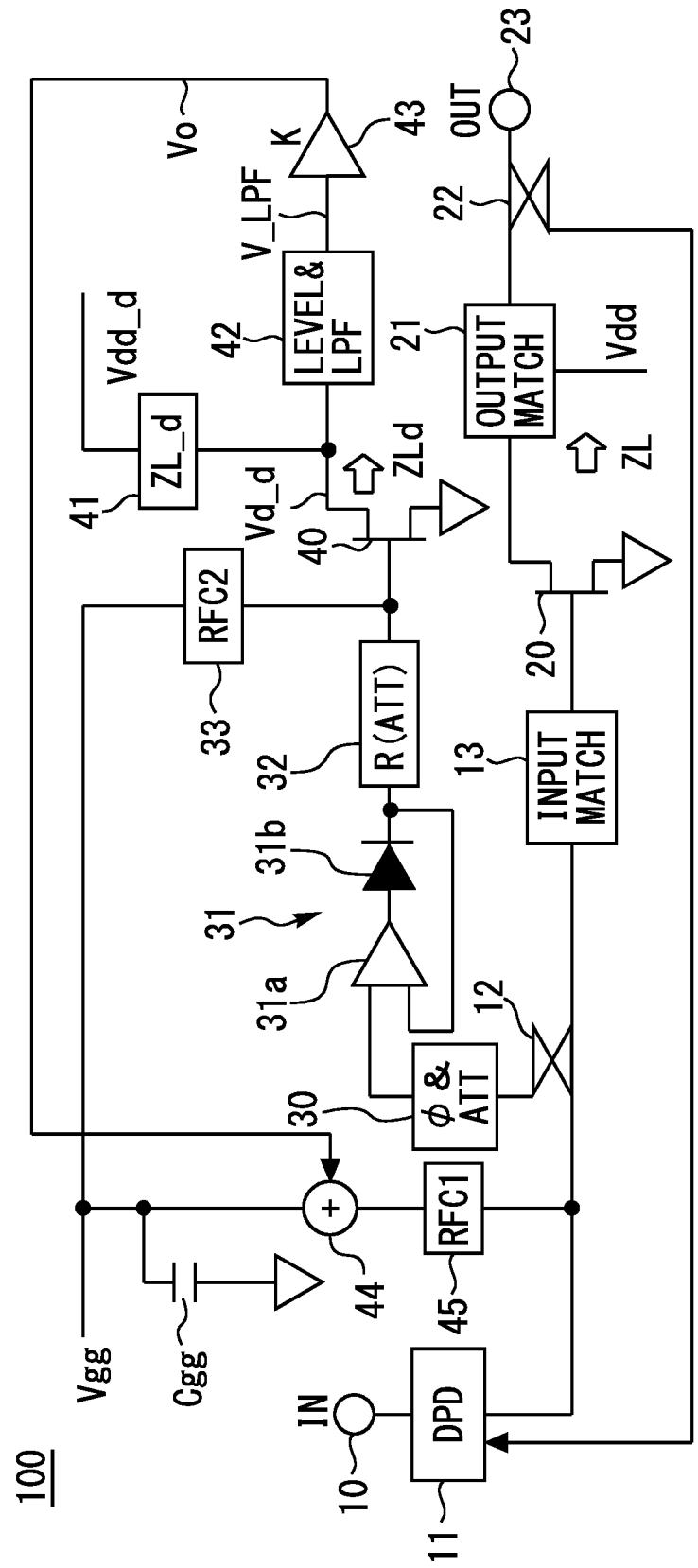
FIG. 1 is a view illustrating a circuit configuration of a power amplifier according to a first embodiment.

A power amplifier according to each embodiment is described with reference to drawings. Identical or corresponding constitutional elements are given the same reference numerals, and the repeated description of such constitutional elements may be omitted.

First Embodiment

FIG. 1 is a view illustrating a circuit configuration of a power amplifier 100 according to a first embodiment. The power amplifier 100 performs distortion compensation operation by applying a digital predistorter (DPD). The power amplifier 100 amplifies an amplitude-modulated input signal. The power amplifier 100 is formed with, for example, a GaN compound semiconductor. In the power amplifier 100, a DPD 11 is connected to an input terminal 10. A directional coupler 12 that branches an input signal from the input terminal 10 is connected to an output of the DPD 11. A gate terminal of a main transistor 20 is connected to one output of the directional coupler 12 via an input matching circuit 13. A phase shifter/attenuator 30 is connected to the other output of the directional coupler 12.

The main transistor 20 is a transistor for power amplification. The main transistor 20 amplifies an input signal input from the gate terminal and outputs the amplified input signal from a drain terminal. A drain bias voltage Vdd is applied to the drain terminal of the main transistor 20 via an output matching circuit 21. The drain terminal of the main transistor 20 is connected to a directional coupler 22 via the output matching circuit 21. An output terminal 23 is connected to one out of the directional coupler 22. The other output of the directional coupler 22 is connected to the DPD 11.

The phase shifter/attenuator 30 is constituted with a phase shifter and an attenuator. An output of the phase shifter/attenuator 30 is connected to an envelope detector 31. The envelope detector 31 detects an envelope of the signal branched by the directional coupler 12. In other words, the envelope detector 31 extracts a low-frequency component of the input signal. The envelope detector 31 is constituted with an operational amplifier 31a and a diode 31b. The operational amplifier 31a is connected to an output of the phase shifter/attenuator 30. An anode of the diode 31b is connected to an output of the operational amplifier 31a. A smoother/attenuator 32 is connected to a cathode of the diode 31b. The smoother/attenuator 32 is constituted with a smoothing circuit and an attenuator. The directional coupler 12, the phase shifter/attenuator 30, the envelope detector 31 and the smoother/attenuator 32 correspond to a signal generation circuit that generates an envelope signal from an input signal input from the input terminal 10.

An output of the smoother/attenuator 32 is connected to a gate terminal of a replica transistor 40. A temperature of the replica transistor 40 changes in accordance with a temperature of the main transistor 20. The envelope signal of the input signal is input to a gate terminal of the replica transistor 40. Further, a gate bias voltage Vgg is applied to the gate terminal of the replica transistor 40 via an RF choke circuit 33.

A drain bias voltage Vdd_d is applied to a drain terminal of the replica transistor 40 via a load circuit 41. An extraction circuit 42 is connected to the drain terminal of the replica transistor 40. The extraction circuit 42 includes a level control circuit and a low pass filter. An output of the extraction circuit 42 is connected to an adder 44 via a buffer amplifier 43.

The adder 44 adds an output signal of the buffer amplifier 43 to the gate bias voltage Vgg to be applied to the main transistor 20. An output of the adder 44 is connected to a line that connects the input terminal 10 and the gate terminal of the main transistor 20 via an RF choke circuit 45. An RF band decoupling capacitor Cgg for gate bias is connected to a line that inputs the gate bias voltage Vgg to the adder 44.

Figure 2:
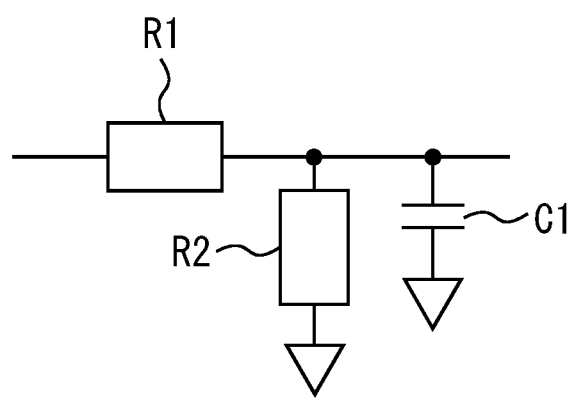
FIG. 2 is a view illustrating a circuit configuration of the smoother/attenuator according to the first embodiment.

FIG. 2 is a view illustrating a circuit configuration of the smoother/attenuator 32 according to the first embodiment. The smoother/attenuator 32 includes a resistor R1 provided on a line that connects the output of the envelope detector 31 and the gate terminal of the replica transistor 40. Further, a resistor R2 and a capacitor C1 are connected between the line and a ground terminal.

Figure 3:
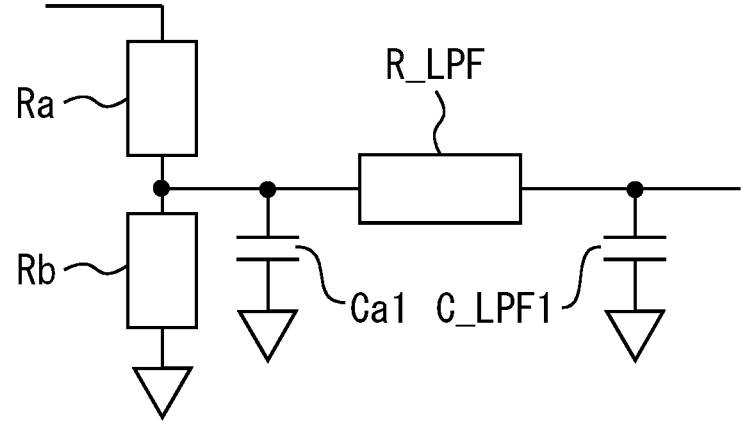
FIG. 3 is a view illustrating a circuit configuration of the extraction circuit according to the first embodiment.

FIG. 3 is a view illustrating a circuit configuration of the extraction circuit 42 according to the first embodiment. In the extraction circuit 42, a series circuit of resistors Ra and Rb are connected between the drain terminal of the replica transistor 40 and the ground terminal. One end of a capacitor Ca1 and one end of a resistor R_LPF are connected to a connection point of the resistors Ra and Rb. The other end of the capacitor Ca1 is connected to the ground terminal. The resistors Ra and Rb and the capacitor Ca1 constitute the level control circuit. The other end of the resistor R_LPF is connected to one end of a capacitor C_LPF1 and an input of the buffer amplifier 43. The other end of the capacitor C_LPF1 is connected to the ground terminal. The resistor R_LPF and the capacitor C_LPF1 constitute the low pass filter.

In a power amplifier of a mobile phone base station typified by 4G and 5G, typically, high output operation and high linear operation are required to transmit a radio wave with no distortion to a remote place. A radio wave with no distortion is a signal with a lower error rate upon reception. Further, typically, high efficiency operation is strongly required to reduce power consumption at the base station. To satisfy such requirements, there is a case where a DPD is used.

Figure 4:
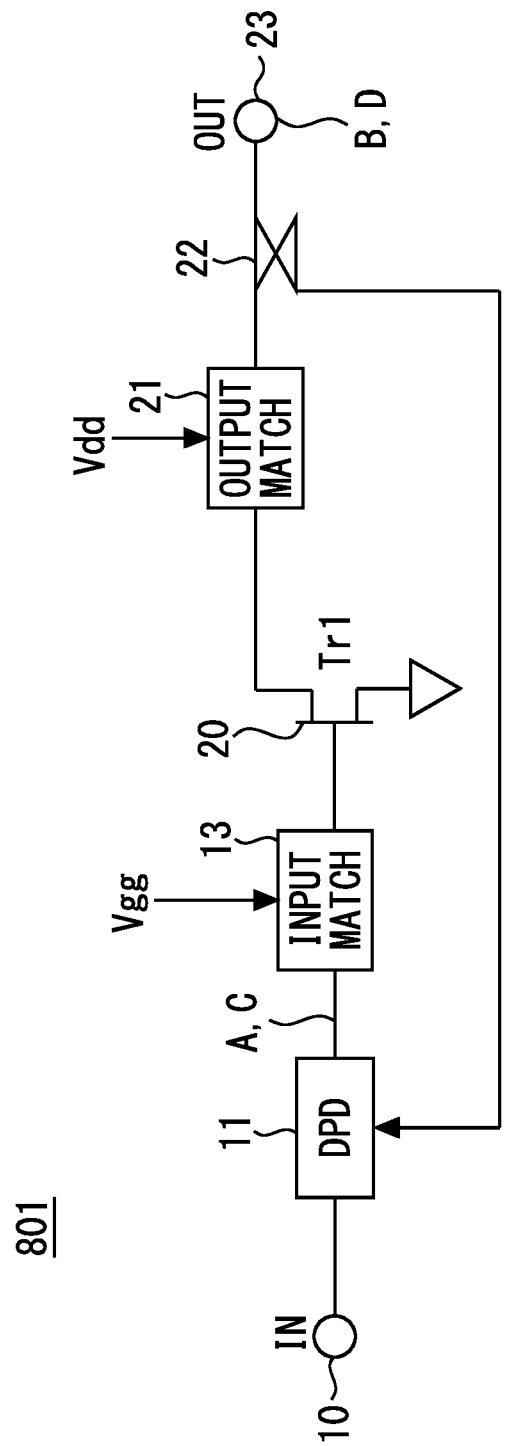
FIG. 4 is a view illustrating a circuit configuration of a power amplifier according to a first comparative example.

FIG. 4 is a view illustrating a circuit configuration of a power amplifier 801 according to a first comparative example. In the power amplifier 801, the DPD 11 is arranged on an input side of the main transistor 20. In the power amplifier 801, an input signal that compensates for intermodulation distortion (IMD) generated at the main transistor 20 is applied.

Figure 5A:
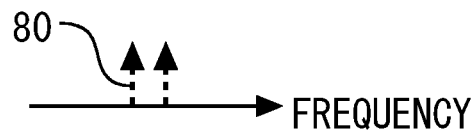
FIG. 5A is a view illustrating original input signals of the power amplifier according to the first comparative example.
Figure 5B:
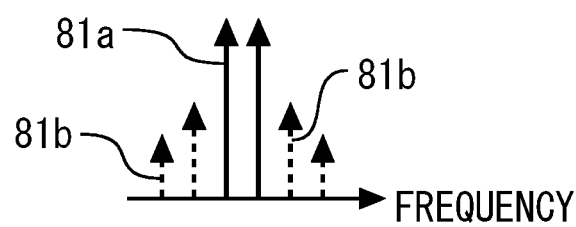
FIG. 5B is a view illustrating amplified signals.

Compensation for intermodulation distortion will be described next. FIG. 5A to FIG. 5D respectively illustrate waveforms from a point A to a point D in FIG. 4. FIG. 5A is a view illustrating original input signals 80 of the power amplifier 801 according to the first comparative example. Here, two signals with different frequencies are assumed as the input signals 80. FIG. 5B is a view illustrating amplified signals. If the input signals 80 are amplified at the power amplifier 801, intermodulation distortion 81$b$ is generated on both sides of two main signals 81$a$. FIG. 5B illustrates third-order IMD and fifth-order IMD.

Figure 5C:
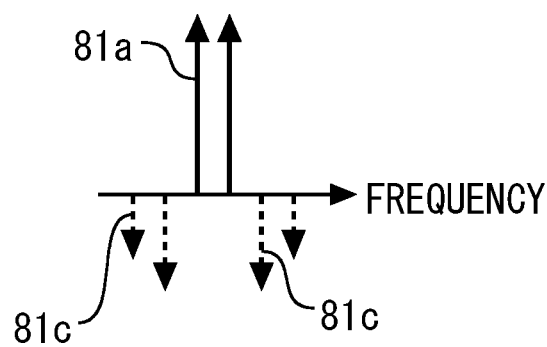
FIG. 5C is a view illustrating the signals having the distortion component having the reverse phase.
Figure 5D:
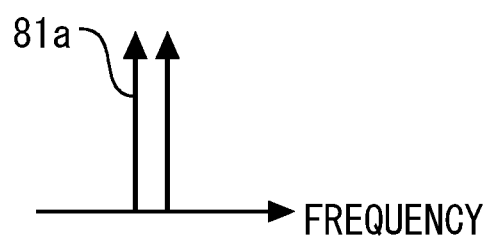
FIG. 5D is a view illustrating the amplified signals with no distortion.

Partial signals are taken out at the directional coupler 22 positioned on an output side of the main transistor 20 and returned to the DPD. The DPD 11 extracts third-order IMD and fifth-order IMD components from the returned signals. Further, the DPD 11 inputs signals having a distortion component 81$c$ that has a reverse phase of a phase of the extracted intermodulation distortion 81$b$ to the main transistor 20. FIG. 5C is a view illustrating the signals having the distortion component 81$c$ having the reverse phase. The distortion component 81$c$ having the reverse phase of the phase of the intermodulation distortion 81$b$ is applied, and thus, the main transistor 20 outputs two amplified main signals 81$a$ with no distortion. FIG. 5D is a view illustrating the amplified signals with no distortion.

Figure 7:
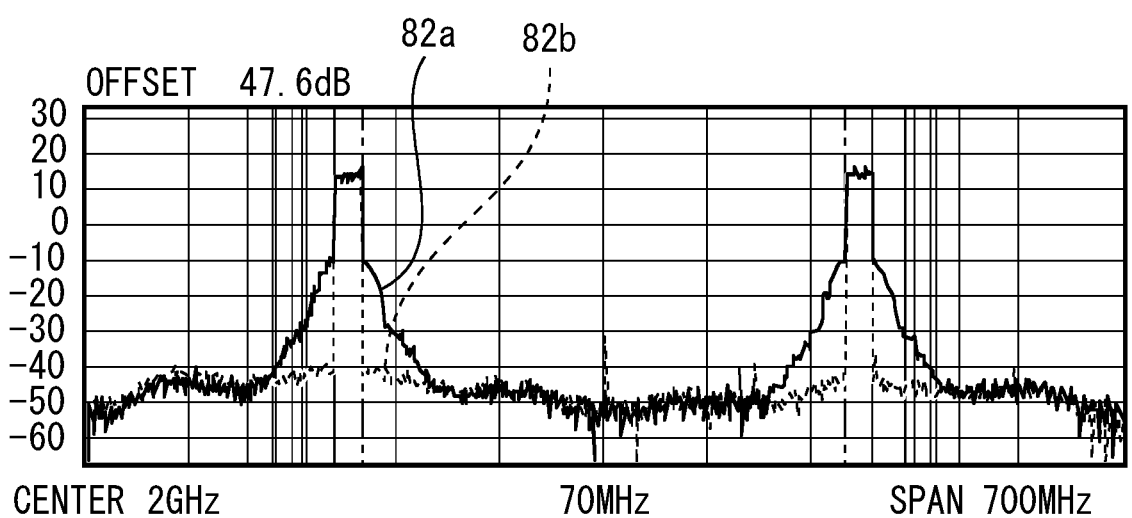
FIG. 7 is a view illustrating an example of output spectrum waveforms of the power amplifier in a case where DPD compensation is not performed and in a case where DPD compensation is performed.

Such procedure of distortion compensation is sequentially performed by the DPD 11 learning for each time range determined in advance. By this means, an output signal from the base station has low distortion as illustrated in FIG. 7 which will be described later. Functions of the DPD 11 are similar in the power amplifier 100 according to the present embodiment.

Figure 6:
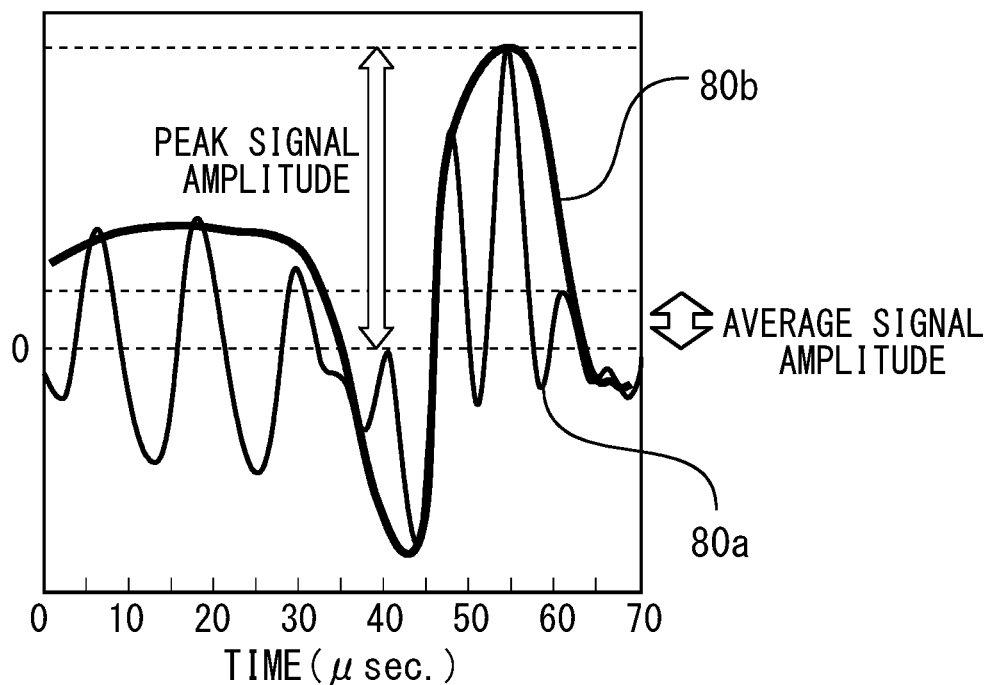
FIG. 6 is a view illustrating an example of input signal waveforms in a case where DPD compensation is not performed, which are to be used at a base station of 4G and 5G.

FIG. 6 is a view illustrating an example of input signal waveforms in a case where DPD compensation is not performed, which are to be used at a base station of 4G and 5G. FIG. 6 illustrates an example of modulation signal waveforms of orthogonal frequency division multiplexing (OFDM) to be used in transmission from the base station. In a case where DPD compensation is not performed, a difference between an average signal amplitude and a peak signal amplitude is large.

FIG. 7 is a view illustrating an example of output spectrum waveforms of the power amplifier in a case where DPD compensation is not performed and in a case where DPD compensation is performed. If the signals as illustrated in FIG. 6 are amplified at the power amplifier, a number of intermodulation distortion components as illustrated in FIG. 5B are generated. By this means, a spectrum waveform 82$a$ in a case where DPD compensation is not performed in FIG. 7 rises on both sides of a main signal band due to the distortion component. Thus, there is a possibility that the distortion component may leak to signal bands adjacent to the main signal band.

If DPD compensation is performed, the distortion component is drastically reduced as in a spectrum waveform 82$b$ in a case where DPD compensation is performed in FIG. 7. This makes it possible to keep high signal quality in the adjacent signal bands.

In 4G, the power amplifier at the base station continuously amplifies RF signals. In contrast, in 5G, basically, burst operation is performed. This is because, in 5G, time division duplex (TDD) operation is performed, and the same frequency band is used between uplink and downlink. Here, the uplink indicates communication from a terminal to a base station, and the downlink indicates communication from a base station to a terminal.

Figure 8:
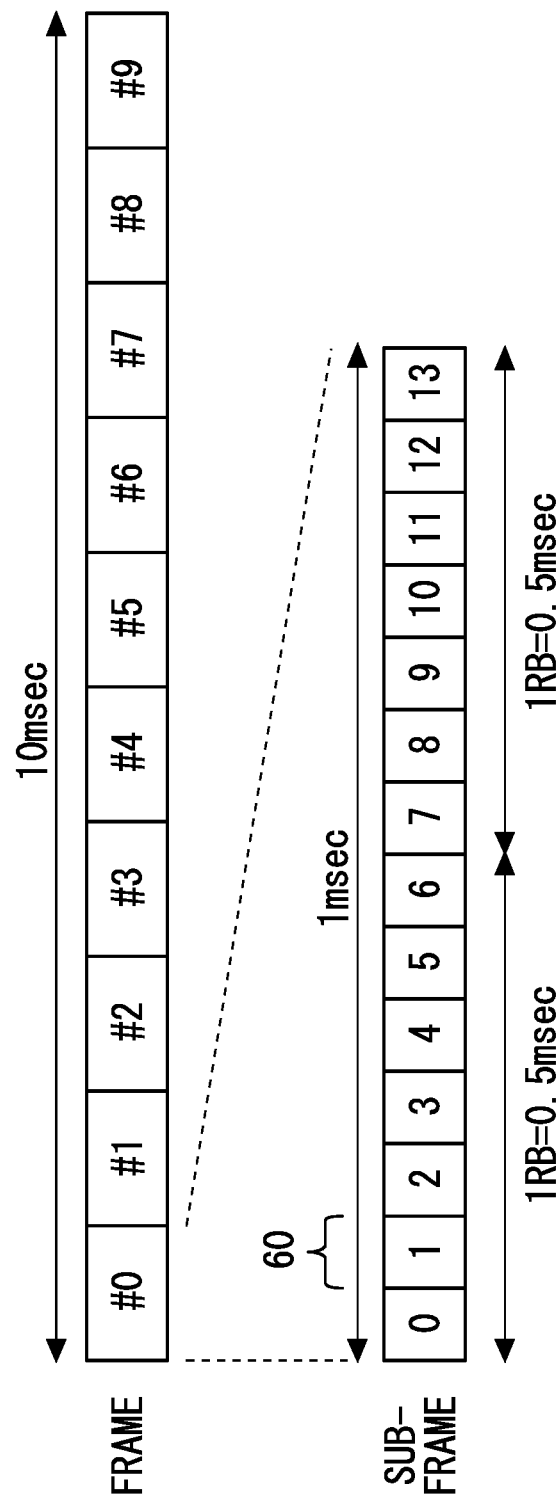
FIG. 8 is a view illustrating a frame structure of a signal in 5G.
Figure 9:
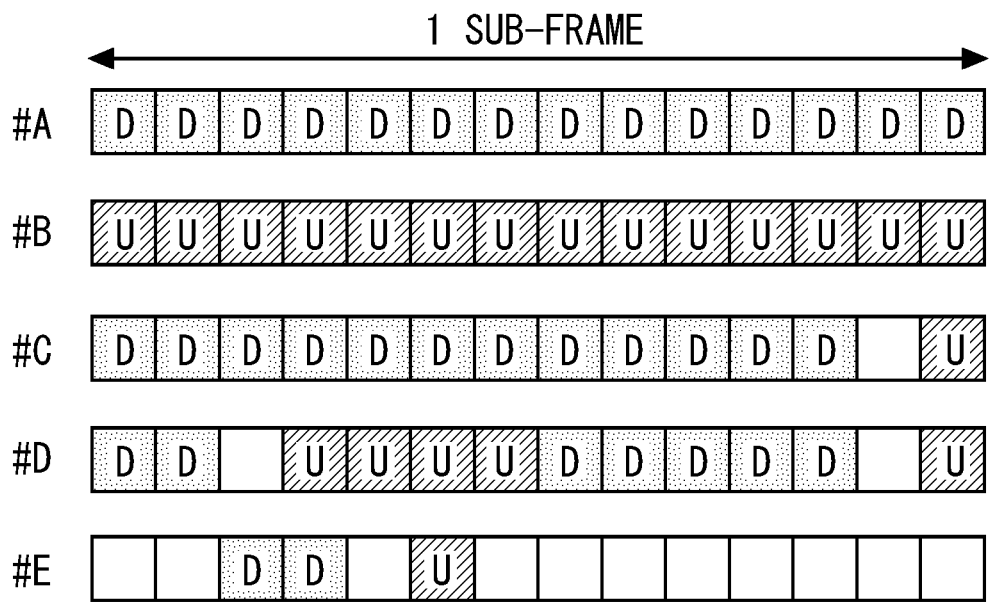
FIG. 9 is a view illustrating a structure of a sub-frame.

FIG. 8 is a view illustrating a frame structure of a signal in 5G. FIG. 9 is a view illustrating a structure of a sub-frame. In FIG. 9, D indicates a downlink section, and U indicates an uplink section. One frame is 10 milliseconds, and one frame includes ten sub-frames. One sub-frame is constituted with 14 symbols 60. One symbol is approximately 71 microseconds. #A to #E in FIG. 9 respectively indicate examples of patterns of the downlink and the uplink within the sub-frames. In #C to #E, downlink is intermittently performed in symbol unit.

For example, Si-laterally diffused metal-oxide-semiconductor (LDMOS) is used as the power amplifier for base station in a band equal to or lower than 3 GHz. In contrast, if the frequency becomes higher to approximately 3 GHz to 6 GHz, there is a case where a GaN transistor as a wide-band gap compound semiconductor in a microwave band is used as the power amplifier for base station. The GaN transistor typically has high gain. Further, the GaN transistor can perform amplification operation at a higher voltage from 40 to 50 V than operation at 28 V of the Si-LDMOS. Further, the GaN transistor can typically perform operation with higher efficiency than the Si-LDMOS as well as having high power density per unit gate width.

Figure 10:
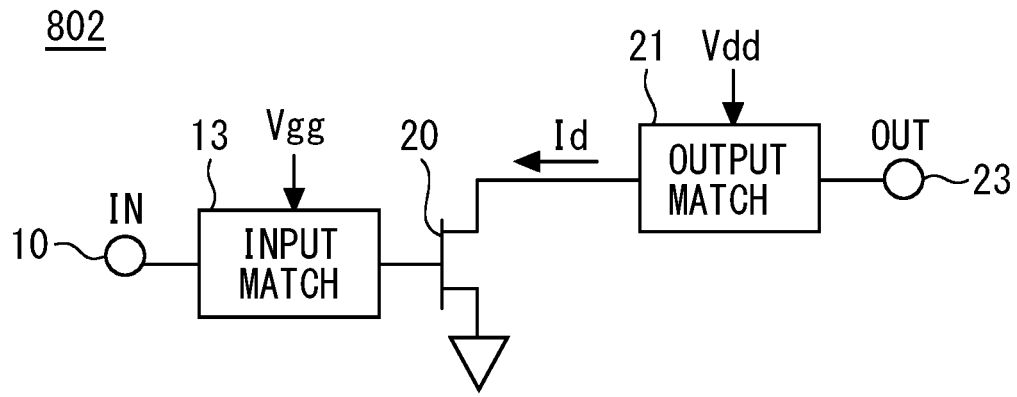
FIG. 10 is a view illustrating a circuit configuration of a power amplifier according to a second comparative example.

However, in a case where the GaN transistor is applied to the power amplifier, a problem of a late transient response of a drain current in burst operation may arise. FIG. 10 is a view illustrating a circuit configuration of a power amplifier 802 according to a second comparative example. In the power amplifier 802, the gate bias voltage Vgg is applied to the main transistor 20 which is the GaN transistor. Further, in the power amplifier 802, a drain current Idq while there is no input of an RF signal is set. Idq is also referred to as an idle drain current.

Figure 11A:
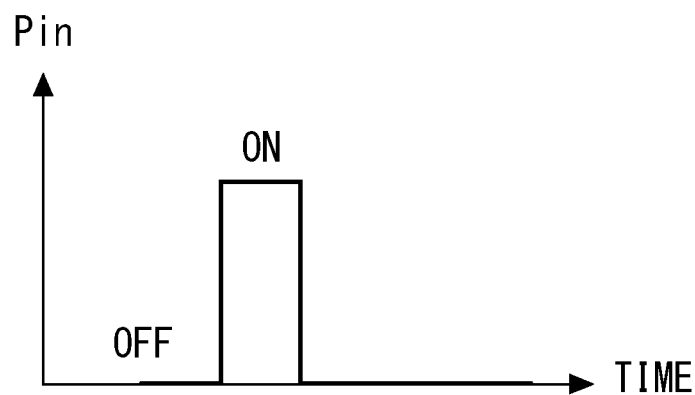
FIG. 11A is a view illustrating a pulsed RF signal.
Figure 11B:
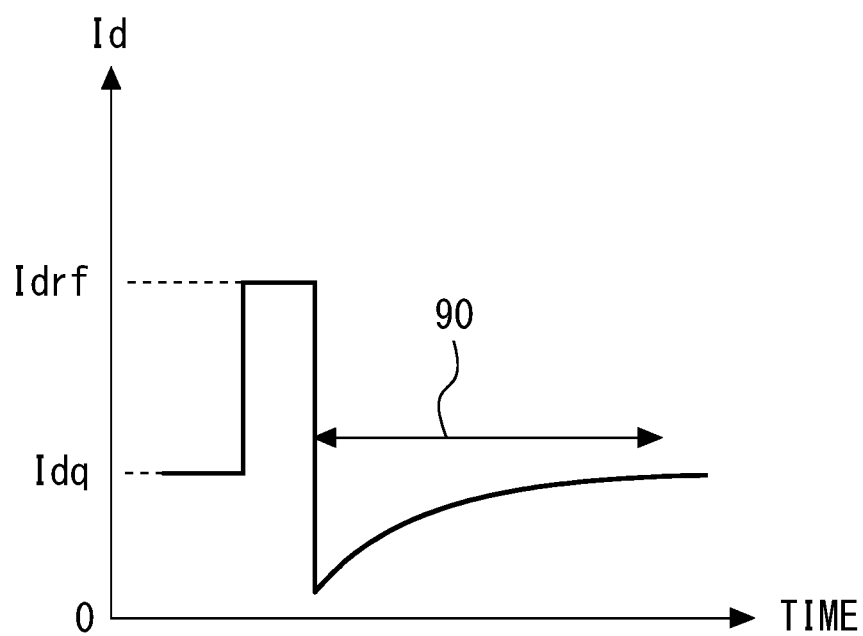
FIG. 11B is a view illustrating a drain current delay.

FIG. 11A is a view illustrating a pulsed RF signal. The pulsed RF signal is applied as the input signal from the input terminal 10. A pulsed RF output is output from the output terminal 23 in accordance with RF pulse power Pin. Behavior of the drain current in this event is characteristic. FIG. 11B is a view illustrating a drain current delay. The drain current increases from Idq to Idrf within a period while the RF signal is applied. Thereafter, if the RF signal is turned off, a phenomenon is sometimes observed that a delay 90 occurs until the drain current is recovered to Idq that is a set value. In this manner, in the drain current delay, if a state of the input signal is switched from an ON state to an OFF state, the drain current is returned to a reference value after the drain current becomes lower than the reference value before the input signal is put into the ON state.

A period of the delay 90 is often several tens of microseconds to several milliseconds if converted into a time constant. The delay may sometimes become equal to or longer than several seconds. It is considered that the drain current delay is caused by an impurity trap existing in a channel layer or a buffer layer of the GaN transistor. This impurity is, for example, Fe or C. Note that the drain current delay is caused by a trap, and thus, the drain current delay is not observed in the Si-LDMOS that does not inherently include a trap of a long time constant.

Figure 11C:
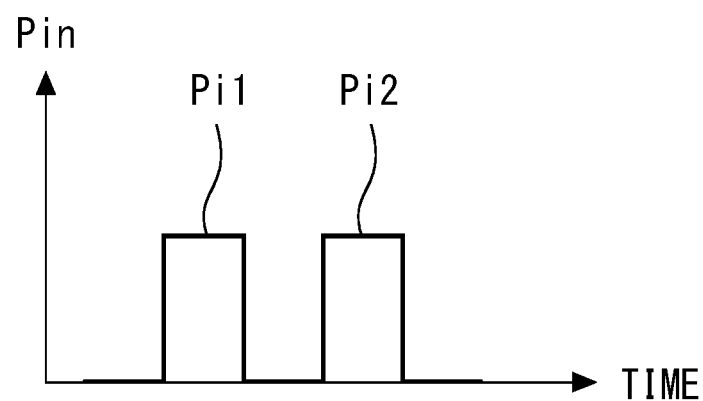
FIG. 11C is a view illustrating two pulsed RF signals.
Figure 11D:
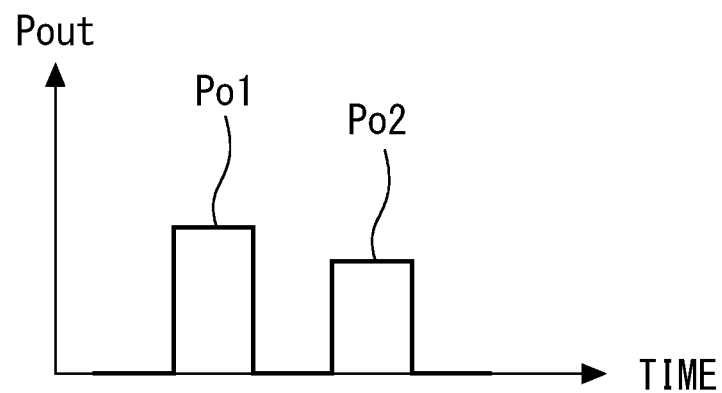
FIG. 11D is a view for explaining output signals of the power amplifier according to the second comparative example.

FIG. 11C is a view illustrating two pulsed RF signals. FIG. 11D is a view for explaining output signals of the power amplifier 802 according to the second comparative example. As illustrated in FIG. 11C, if two pulses that are continuous at a relatively narrow interval are applied, there is a possibility that an output power level corresponding to the second pulse may decrease due to the drain current delay as illustrated in FIG. 11D.

For example, in a case of a system utilizing OFDM modulation typified by 4G or 5G, two pulses correspond to one symbol period. As an example, one symbol period is 70 microseconds, and an interval of the pulses is 5 microseconds to 200 microseconds.

Figure 12A:
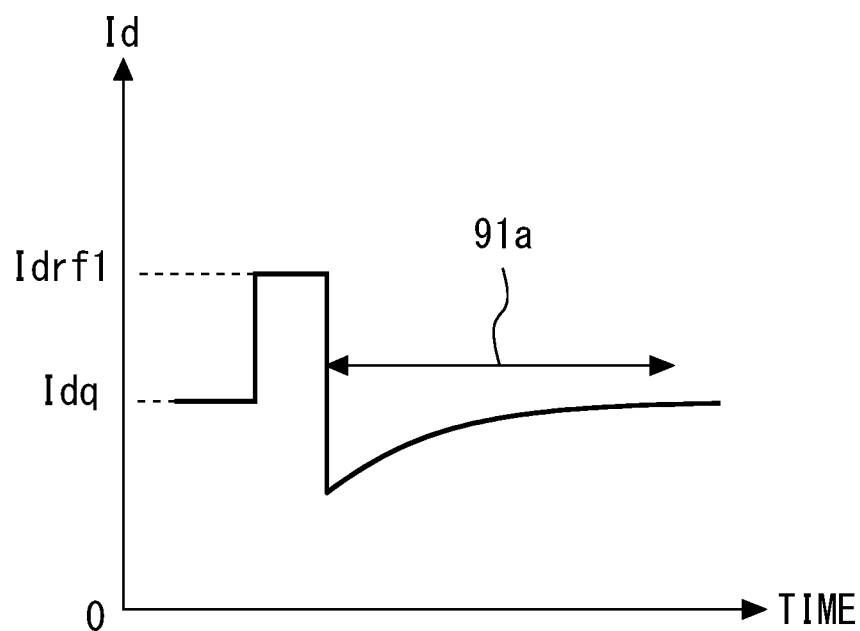
FIG. 12A is a view illustrating a process of recovery of the drain current in a case where a value of the drain current upon pulse application is small.
Figure 12B:
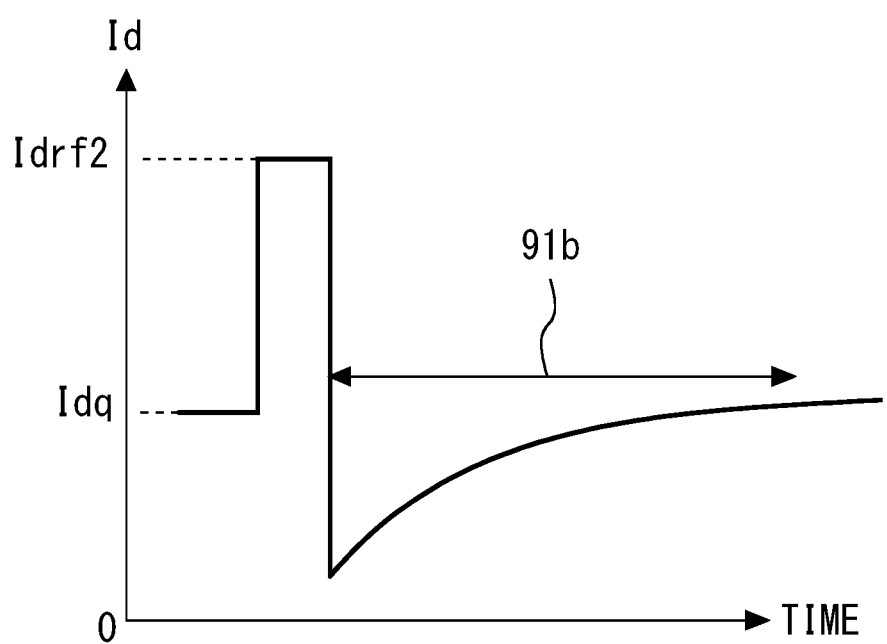
FIG. 12B is a view illustrating a process of recovery of the drain current in a case where a value of the drain current upon pulse application is large.

A power level Po2 of the second pulse illustrated in FIG. 11D depends on a power level Po1 of the first pulse. FIG. 12A is a view illustrating a process of recovery of the drain current in a case where a value of the drain current upon pulse application is small. FIG. 12B is a view illustrating a process of recovery of the drain current in a case where a value of the drain current upon pulse application is large. As illustrated in FIG. 12A and FIG. 12B, the values of the drain currents in the process of recovery are different in accordance with the values of the drain currents Idrf1 and Idrf2 upon pulse application, and a difference also occurs between a delay 91a and a delay 91b. In other words, even if an elapsed period since the pulse has been turned off is the same, a difference occurs in the drain current. Thus, the power level Po2 of the second pulse depends on the power level Po1 of the first pulse.

Figure 13:
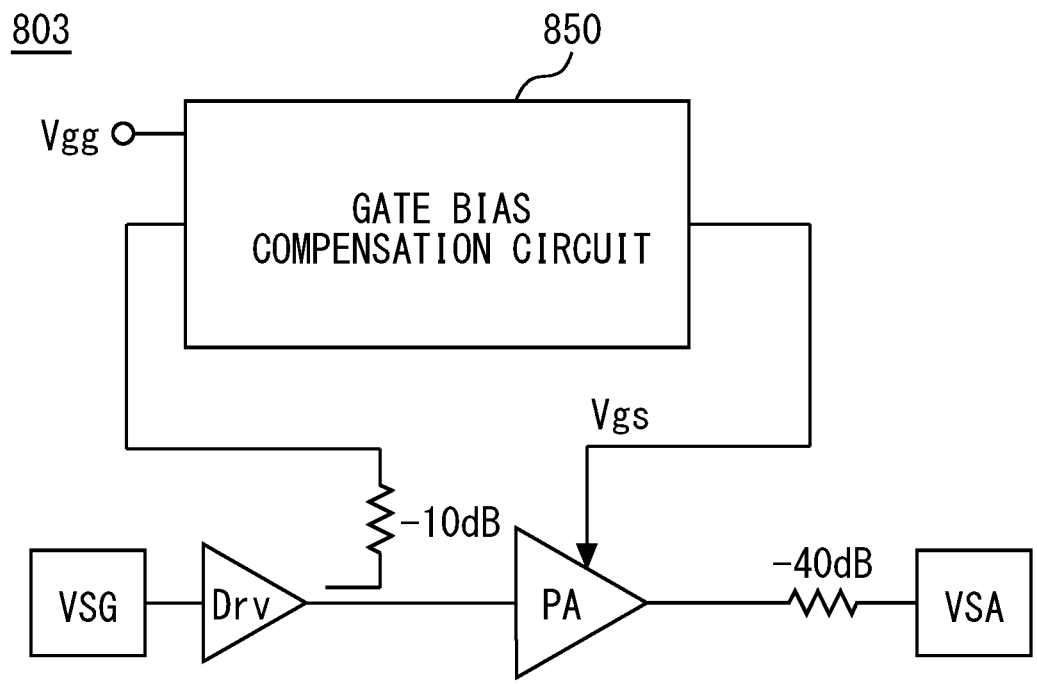
FIG. 13 is a view illustrating a circuit configuration of a power amplifier according to a third comparative example.
Figure 14:
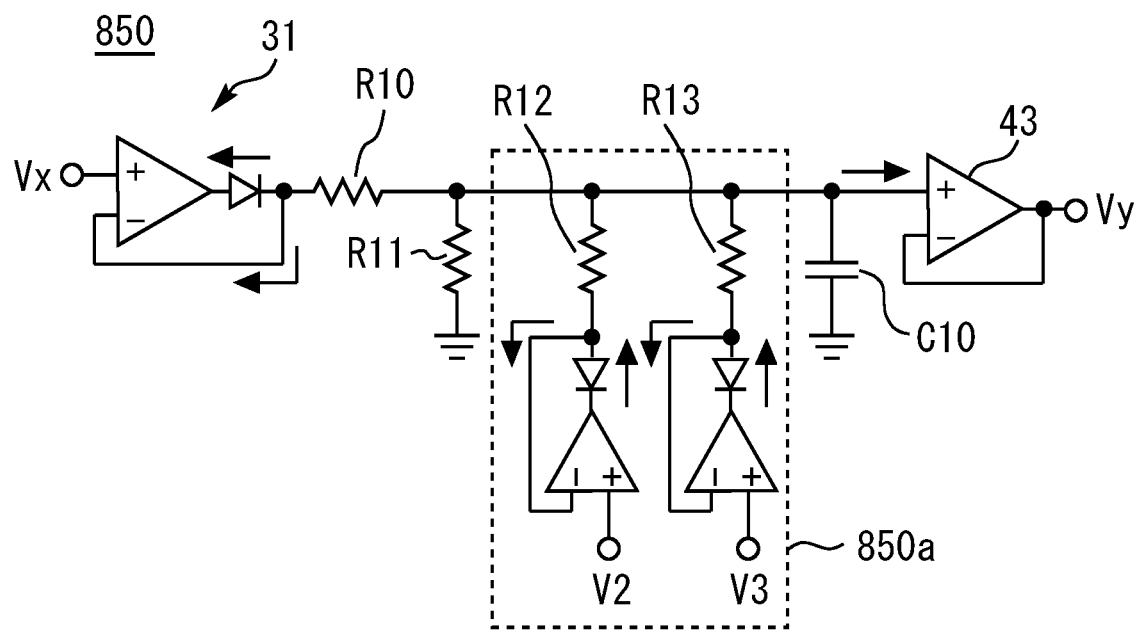
FIG. 14 is a view for explaining a circuit configuration that compensates for a drain current delay according to the third comparative example.

FIG. 13 is a view illustrating a circuit configuration of a power amplifier 803 according to a third comparative example. FIG. 14 is a view for explaining a circuit configuration that compensates for a drain current delay according to the third comparative example. In the power amplifier 803, an RF signal is branched from a coupled output of a directional coupler provided on an input side of a GaN-Tr power amplification unit. The branched signal is input to a gate bias compensation circuit 850 to compensate for the drain current delay. A voltage signal obtained from the gate bias compensation circuit 850 is applied to the gate bias voltage. As a result of this, degradation of a vector error (error vector magnitude (EVM)) due to the drain current delay can be compensated for. Note that the voltage signal obtained from the gate bias compensation circuit 850 is smoothed and has low frequency components.

The envelope detector 31 is provided on an input side of the gate bias compensation circuit 850 according to the third comparative example, and the buffer amplifier 43 which is an inverting amplification unit is connected to an output side. A smoother/attenuator including resistors R10 and R11 and a capacitor C10 is connected between the envelope detector 31 and the buffer amplifier 43. Further, a drain current delay simulation unit 850a is connected between the envelope detector 31 and the buffer amplifier 43. The drain current delay simulation unit 850a is constituted with an operational amplifier to which voltages V2 and V3 are supplied, a diode, and resistors R12 and R13.

Figure 15A:
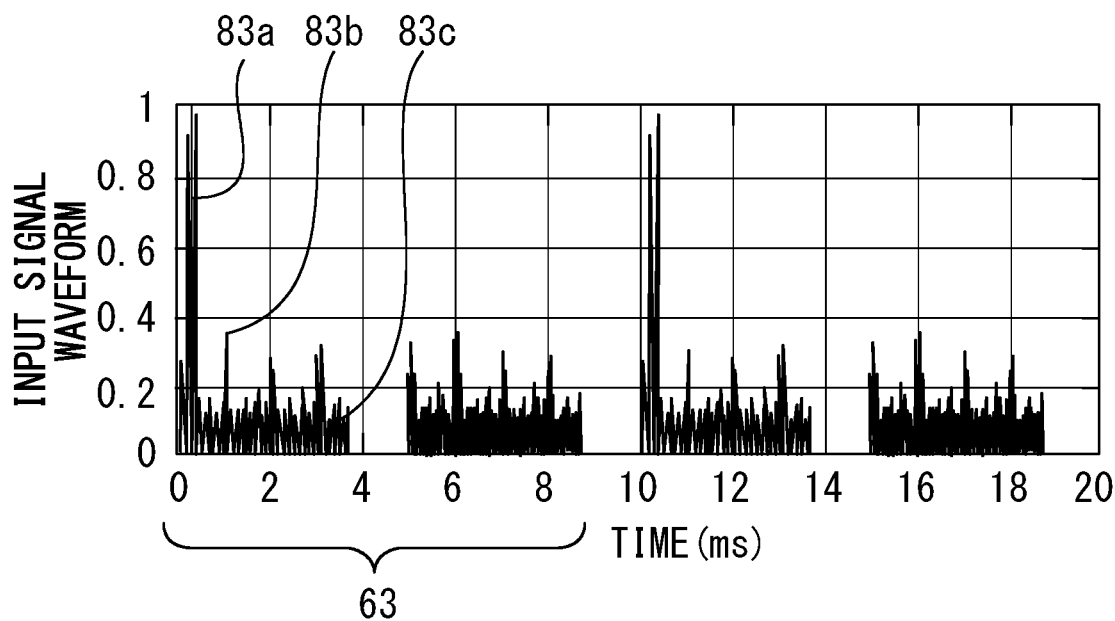
FIG. 15A is a view illustrating test patterns to be input to the power amplifier in which the drain current delay occurs.
Figure 15B:
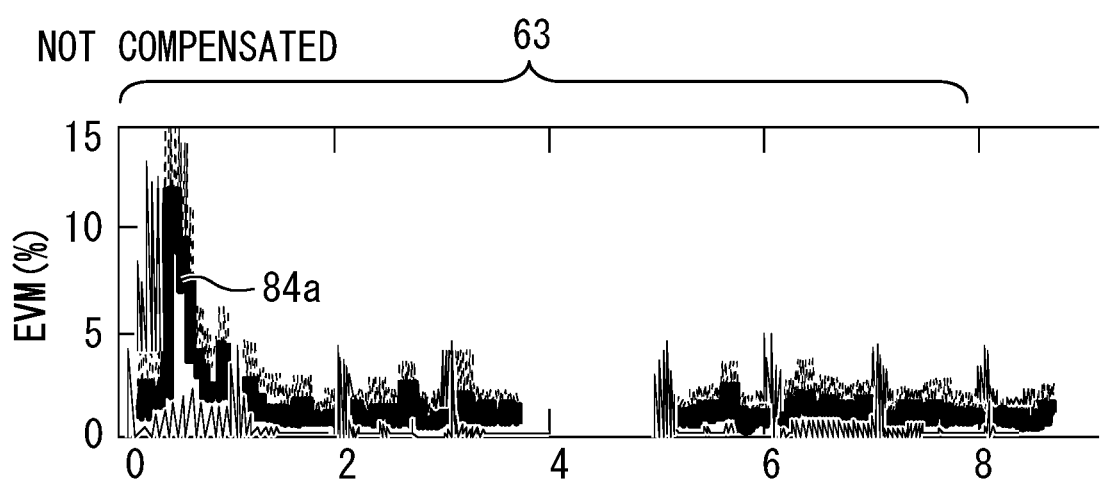
Figure 15C:
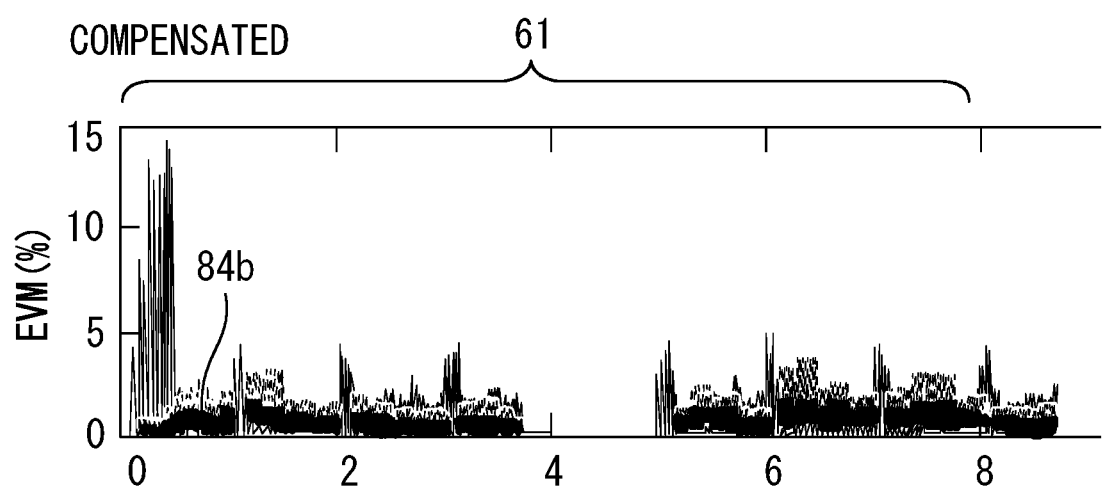
FIG. 15C is a view illustrating a vector error in a case where the drain current delay is compensated for according to the third comparative example.

FIG. 15A is a view illustrating test patterns to be input to the power amplifier in which the drain current delay occurs. The test patterns include a high level signal 83a, a medium level signal 83b and a low level signal 83c. FIG. 15B is a view illustrating a vector error in a case where the drain current delay is not compensated for. FIG. 15C is a view illustrating a vector error in a case where the drain current delay is compensated for according to the third comparative example. FIG. 15B and FIG. 15C illustrate a vector error corresponding to a period 63 in FIG. 15A. FIG. 15B and FIG. 15C illustrate measurement results of a vector error that is an index of signal quality in a case where the test patterns of the OFDM signal illustrated in FIG. 15A are applied.

In a case where the DPD is caused to operate in a state where a circuit that compensates for the drain current delay is not provided, as indicated in the waveform 84a in FIG. 15B, a worst value of the EVM becomes greater than 10%. In this manner, signal quality greatly degrades. In contrast, in a case where the DPD is caused to operate in a state where a circuit that compensates for the drain current delay is provided, as indicated in the waveform 84b in FIG. 15C, the worst value of the EVM becomes 1 to 2%. In this manner, signal quality is drastically improved.

The DPD learns distortion characteristics of the power amplifier as described above and corrects the input signal so as to cancel out the distortion characteristics. The learning effectively acts with respect to a relatively short period, for example, approximately one symbol to several symbols. However, the DPD often cannot sufficiently correct a slow change of gain or a phase due to the drain current delay caused by a relatively long trap of, for example, several hundreds of microseconds to several milliseconds in the GaN transistor.

The compensation circuit in FIG. 14 simulates such a long time constant and applies an extra gate voltage corresponding to the drain current delay to the GaN transistor. This can prevent fluctuation of an idle current of the GaN transistor and can cause the DPD to function with high accuracy.

Figure 16A:
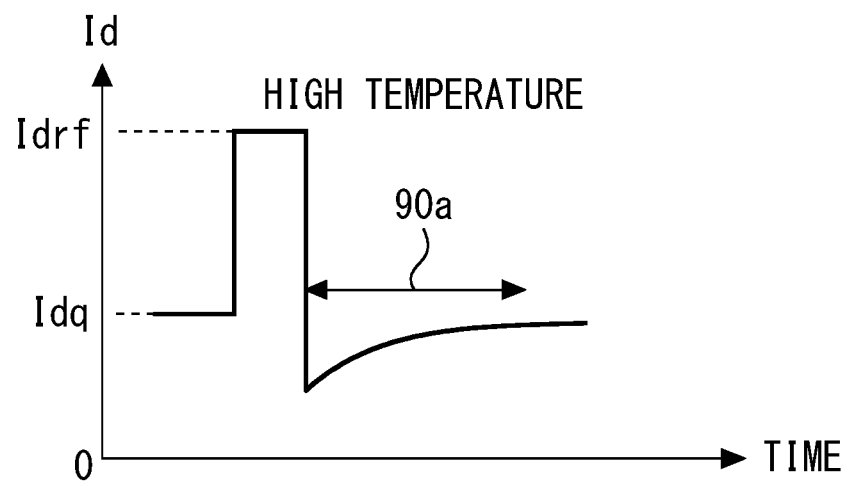
FIG. 16A is a view illustrating a drain current delay at a high temperature.
Figure 16B:
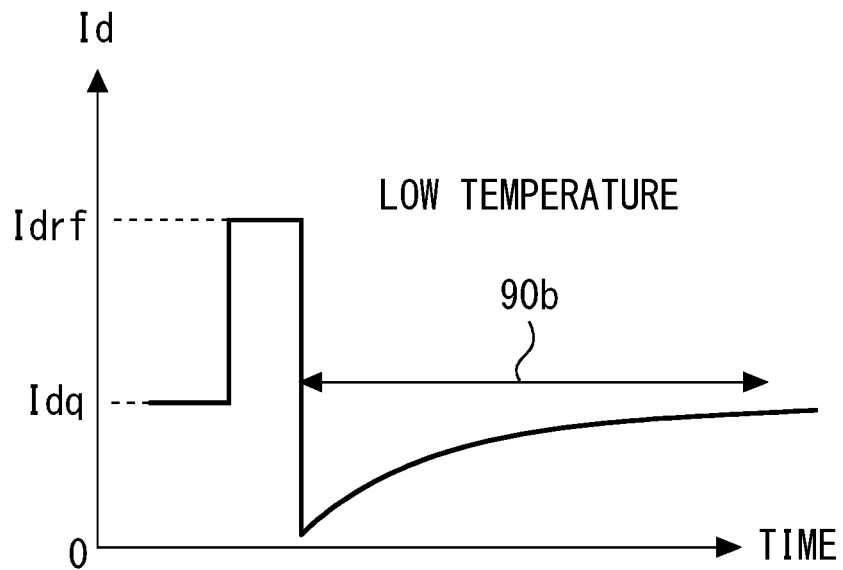
FIG. 16B is a view illustrating a drain current delay at a low temperature.

FIG. 16A is a view illustrating a drain current delay at a high temperature. FIG. 16B is a view illustrating a drain current delay at a low temperature. The compensation circuit in FIG. 14 can sufficiently compensate for the drain current delay for the time constant determined in advance at the circuit. However, this time constant changes in accordance with a temperature as indicated as delays 90a and 90b in FIG. 16A and FIG. 16B. In the example in FIG. 16A and FIG. 16B, the time constant becomes short at a high temperature and becomes long at a low temperature.

In the compensation circuit in FIG. 14, the drain current delay simulation unit 850a simulates the time constant of the drain current delay. However, in order that the drain current delay simulation unit 850a simulates a change of the time constant depending on the temperature change of the GaN transistor, it is necessary to accurately change a resistance value with respect to the temperature. In this case, for example, a variable resistor is required. The variable resistor can be implemented with, for example, a transistor like a field effect transistor (FET). In this case, a resistance value at a certain temperature corresponds to a gate-source voltage. Thus, an auxiliary circuit that reads gate-source voltage information stored in advance on the basis of temperature information sensed by other circuits and applies an appropriate voltage to the variable resistor is required.

In this manner, there is a possibility that a number of auxiliary circuits may be required in order that the compensation circuit in FIG. 14 compensates for the drain current delay of the GaN transistor, including a temperature change. Thus, there is a possibility that a circuit dimension may increase, which may lead to increase in cost.

Operation of the power amplifier 100 according to the present embodiment will be described next. A large portion of the predistorted RF signal output from the DPD 11 is input to the main transistor 20, amplified and output from the output terminal OUT. Part of the RF signal is branched on the replica transistor 40 side at the directional coupler 12. The branched signal passes through the phase shifter/attenuator 30 and becomes an envelope signal at the envelope detector 31. The envelope signal is moderately attenuated at the smoother/attenuator 32 and input to the replica transistor 40.

In this event, a coupling degree of the directional coupler 12 and an attenuation amount of the smoother/attenuator 32 are adjusted so that a ratio of RF power to be input to the main transistor 20 and RF power to be input to the replica transistor 40 becomes a size ratio of the main transistor 20 and the replica transistor 40. The size ratio corresponds to a total gate width radio. The size ratio of the main transistor 20 and the replica transistor 40 is, for example, 20:1 to 50:1.

In a similar manner, load impedances ZL and ZLd of the main transistor 20 and the replica transistor 40 are set to be equal from a viewpoint of a resistance value converted at a unit gate width ratio. In other words, a circuit constant of the load circuit 41 of the replica transistor 40 is set. The load circuit 41 is constituted with a resistor and an inductor or only a resistor. Here, the load impedance ZL often has an inductance component for matching with the main transistor 20 having a capacitance component. The load circuit 41 therefore preferably includes at least a resistance load and an inductor.

In the present embodiment, a frequency of the input signal of the replica transistor 40 is lowered to the envelope. Thus, the load circuit 41 is not limited to a complicated distributed constant circuit and may be a simplified circuit such as a lumped-constant circuit constituted with chip parts. Also in this case, the load impedance ZL can be sufficiently simulated.

An actual input waveform to the power amplifier 100 is a waveform of a relatively large dynamic range including various modulation frequency components as illustrated in FIG. 6 or FIG. 15A. Note that in FIG. 15A, a carrier frequency component is omitted. Here, to simplify explanation, an RF input signal having an envelope of a rectangular pulse shape illustrated in FIG. 11A is assumed.

Figure 17A:
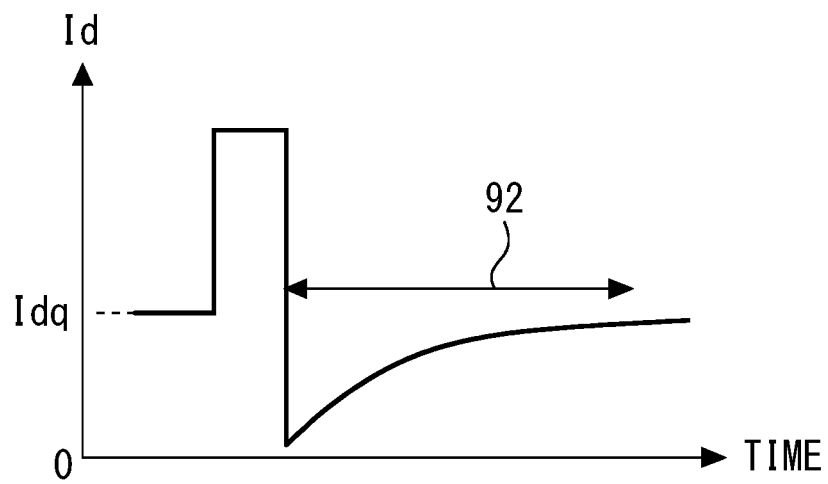
FIG. 17A is a view illustrating a drain current delay of the main transistor according to the first embodiment.

If such an RF input signal is input, a drain current delay having a time constant of, for example, several hundreds of microseconds to several milliseconds is observed in the waveform of the drain current Id of the main transistor 20. FIG. 17A is a view illustrating a drain current delay 92 of the main transistor 20 according to the first embodiment. The main transistor 20 has characteristics of the drain current delay.

Activation energy and a sectional area of a trap that affects the drain current delay are respectively, for example, 0.63 eV and $2.3 \times 10^{-14}$ cm$^2$. From this value, a time constant of the trap at an ambient temperature was calculated as approximately 5.6 milliseconds. Further, as an example, it was confirmed from an experiment that a channel temperature upon operation of the transistor that amplifies the RF signal rose from an environmental temperature by 45 degrees. From this, the time constant of the trap in a case where the environmental temperature was set as the ambient temperature was calculated as approximately 180 microseconds. These calculation results substantially match the drain current delay of several hundreds of microseconds to several milliseconds obtained from the experiment using the power amplifier.

Further, the replica transistor 40 also has characteristics of the drain current delay that are the same as the characteristics of the main transistor 20. In other words, the main transistor 20 and the replica transistor 40 have the same time constant of the drain current delay. The main transistor 20 and the replica transistor 40 may be formed with the same material such as GaN. Further, the main transistor 20 and the replica transistor 40 may be obtained from the same wafer. The main transistor 20 may be different from the replica transistor 40 only in a gate width. For example, in a case where a gate width of the main transistor is 4 mm, a gate width of the replica transistor 40 is 0.2 mm.

The main transistor 20 and the replica transistor 40 have, for example, the same maximum drain current (mA/mm) and maximum mutual conductance (mS/mm) per unit gate width. Further, the main transistor 20 and the replica transistor 40 have, for example, the same gate-source capacitance Cgs (pF/mm), gate-drain capacitance Cgd (pF/mm) and drain-source capacitance Cds (pF/mm) per unit gate width. Still further, the main transistor 20 and the replica transistor 40 have the same gate voltage at which the DC current stops flowing, that is, the same pinch-off voltage. The pinch-off voltage is, for example, −2 to −3 V.

Figure 17B:
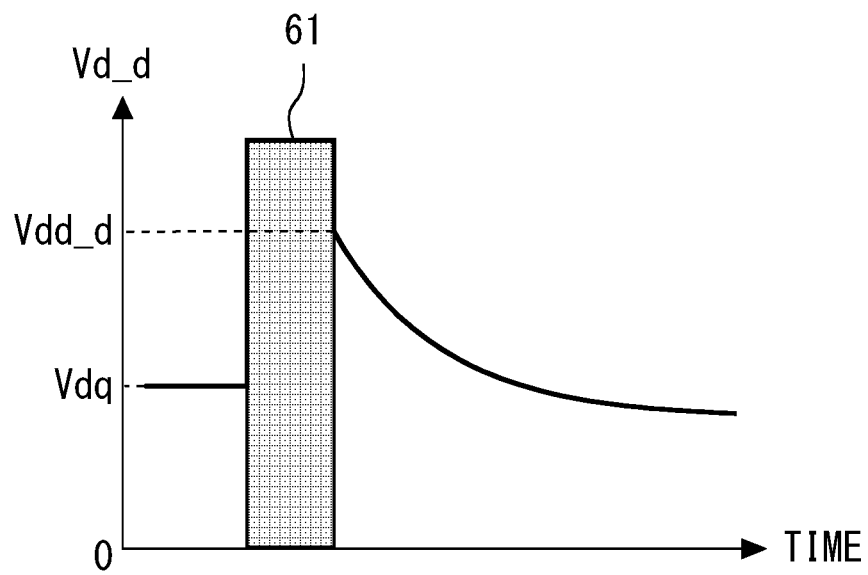
FIG. 17B is a view illustrating an output voltage of the replica transistor according to the first embodiment.

FIG. 17B is a view illustrating an output voltage of the replica transistor 40 according to the first embodiment. The replica transistor 40 also performs amplification operation in accordance with the envelope signal. By this means, the drain voltage Vd_d of the replica transistor 40 changes. In this event, a delay also occurs in the drain voltage Vd_d due to the drain current delay of the replica transistor 40.

Note that a region 61 illustrated in FIG. 17B is a portion corresponding to high-frequency operation. This period corresponds to a period during which information is actually transmitted. During this period, for example, an input waveform as illustrated in FIG. 6 is input to the power amplifier 100. In the input waveform in FIG. 6, a modulation signal 80b is superimposed on a carrier wave 80a. Thus, an amplitude of the carrier wave 80a becomes a peak waveform.

Figure 17C:
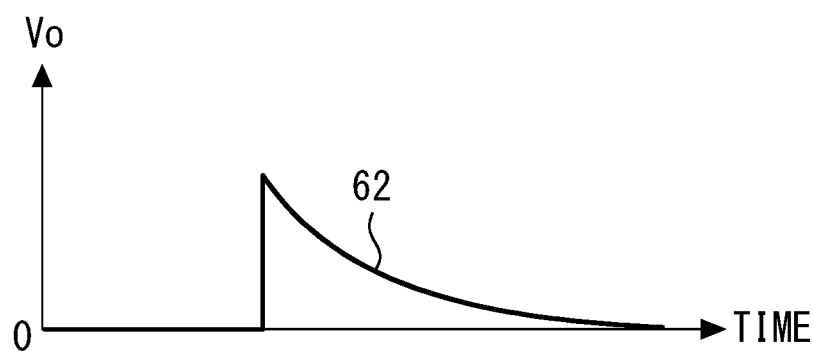
FIG. 17C is a view illustrating the extracted delay component.

The extraction circuit 42 extracts a delay component due to the drain current delay from the output voltage of the replica transistor 40. In other words, a component of the time constant that is desired to be compensated for is taken out from the voltage delay illustrated in FIG. 17B by the level control circuit and the low pass filter. By this means, a component having a time constant from several hundreds of microseconds to several milliseconds is extracted. FIG. 17C is a view illustrating the extracted delay component 62. As specific operation of the extraction circuit 42, the level control circuit decreases a reference level Vdq of the drain voltage Vd_d of the replica transistor 40 to zero. Further, the low pass filter takes out the component of the time constant that is desired to be compensated for.

The load impedance ZLd on the load side when viewed from the drain terminal of the replica transistor 40 is a value obtained by synthesizing input impedances of the load circuit 41 and the extraction circuit 42. Here, the input impedance of the extraction circuit 42 is preferably made sufficiently higher than the impedance of the load circuit 41. This makes it possible to take out a voltage delay waveform Vo of several hundreds of microseconds to several milliseconds via the buffer amplifier 43 without substantially affecting a load curve during RF operation.

Figure 17D:
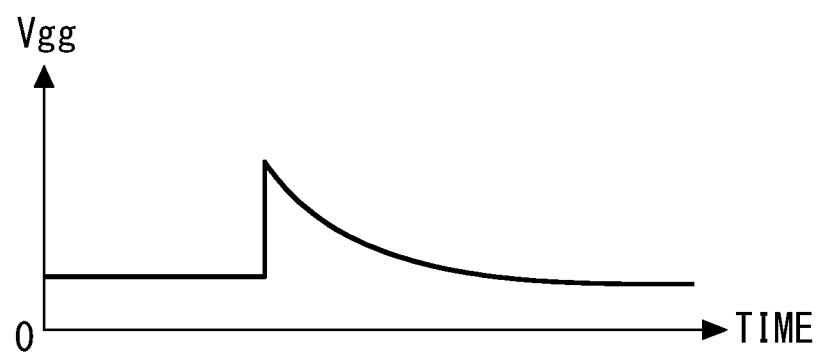
FIG. 17D is a view illustrating a state where a delay component is added to the gate bias voltage Vgg.

During a process of passing through the extraction circuit 42 and the buffer amplifier 43, a level of the voltage delay waveform Vo is adjusted to an appropriate voltage value corresponding to correction corresponding to the drain current delay when the level is converted into the gate bias voltage. This voltage delay waveform Vo is added to the original fixed gate bias voltage Vgg. FIG. 17D is a view illustrating a state where a delay component 62 is added to the gate bias voltage Vgg. In this manner, the adder 44 adds the delay component 62 to the gate bias voltage to be applied to the main transistor 20 so as to cancel out the drain current delay of the main transistor 20.

Figure 17E:
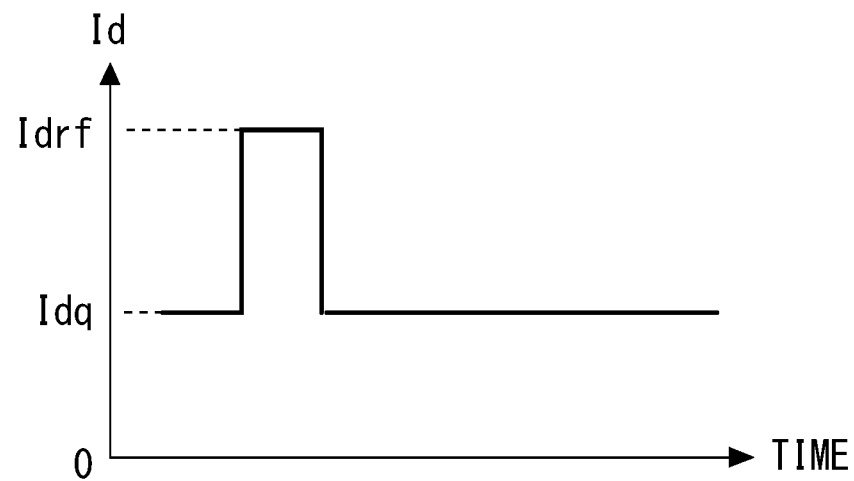
FIG. 17E is a view illustrating a drain current waveform after compensation according to the first embodiment.

FIG. 17E is a view illustrating a drain current waveform after compensation according to the first embodiment. As a result of the gate bias voltage Vgg as illustrated in FIG. 17D being applied, when RF pulse application is stopped, the drain current waveform of the main transistor 20 promptly returns to Idq that is the original set value. This prevents decrease in gain of the subsequent RF pulse as illustrated in FIG. 11D. Further, it is possible to prevent degradation of the EVM as illustrated in FIG. 15C.

Further, in the present embodiment, in a case where a temperature environment of the main transistor 20 changes, a temperature environment of the replica transistor 40 also changes in accordance with the change. Thus, by using the delay component 62 of the replica transistor 40, a temperature change of the drain current delay can be accurately monitored. It is therefore possible to compensate for the drain current delay of the main transistor with respect to the change of the temperature environment and prevent degradation of the EVM. Further, auxiliary circuits such as a temperature sensing device and a storage circuit described in the third comparative example are not required. It is therefore possible to prevent increase in a circuit dimension and increase in cost.

Figure 18:
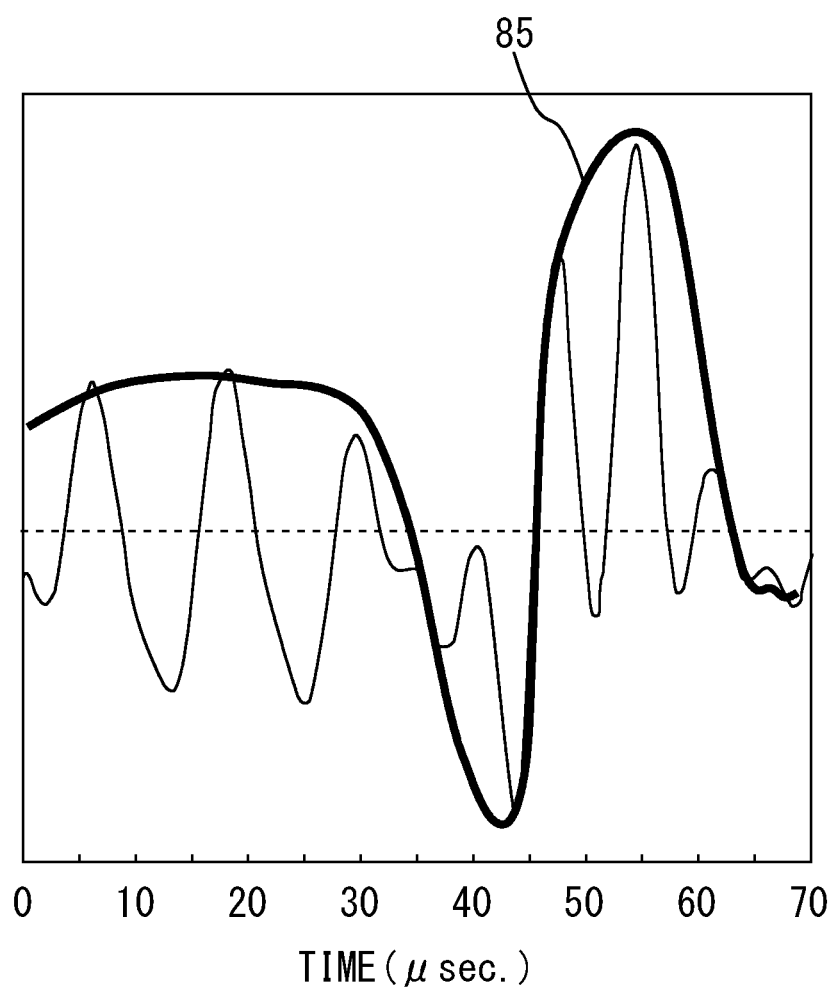
FIG. 18 is a view illustrating an example of an input waveform to a power amplifier according to a fourth comparative example.
Figure 19:
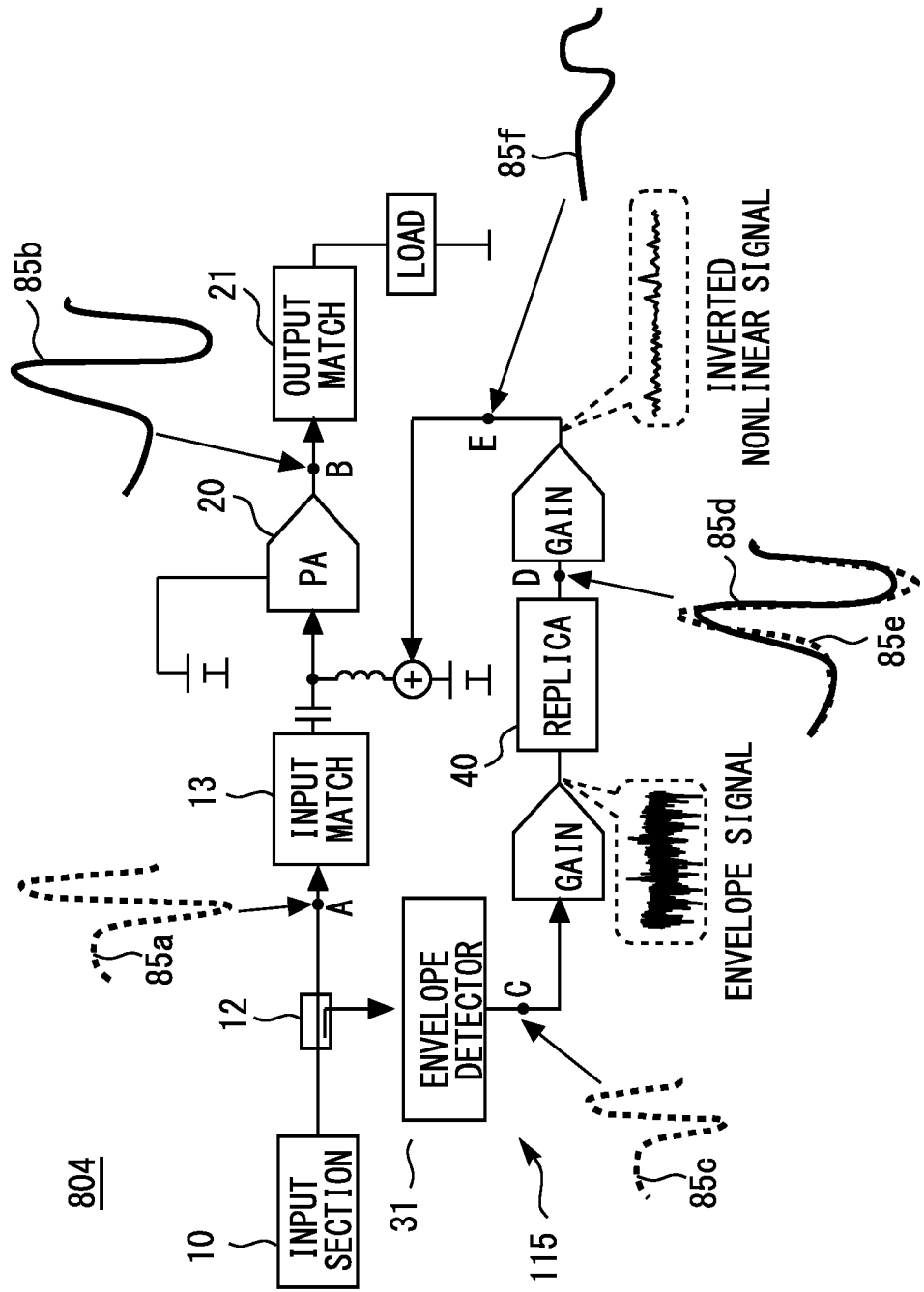
FIG. 19 is a view illustrating a circuit configuration of the power amplifier according to the fourth comparative example.

FIG. 18 is a view illustrating an example of an input waveform to a power amplifier 804 according to a fourth comparative example. FIG. 19 is a view illustrating a circuit configuration of the power amplifier 804 according to the fourth comparative example. The power amplifier 804 according to the fourth comparative examples includes the main transistor 20, the directional coupler 12, the envelope detector 31, the replica transistor 40 and the adder in a similar manner to the present embodiment.

An example of a waveform in which attention is focused on an envelope of each node in a case where RF input power having a large envelope 85 illustrated in FIG. 18 is applied to the power amplifier 804 will be described next. A waveform 85a of a node A corresponds to input power illustrated in FIG. 18. If this input power is amplified at the main transistor 20, a waveform 85b is obtained at anode B. Further, in the power amplifier 804, part of the input power is taken out at the directional coupler 12. The envelope detector 31 detects an envelope of the signal taken out by the directional coupler 12 as indicated in a waveform 85c at a node C. This envelope is applied to the replica transistor 40. An output voltage of the replica transistor 40 has a waveform close to an inverted waveform 85e of the input waveform as indicted in a waveform 85d at a node D. The output voltage of the replica transistor 40 is transformed into a waveform like a waveform 85f at a node E through gain and added to the gate voltage of the main transistor 20.

In the power amplifier 804 according to the fourth comparative example, a common mode voltage of the envelope 85 is simply applied to the gate voltage of the main transistor 20. An effect obtained by compensating for non-linearity of the transistor using such a method is typically extremely small. Further, an effect in terms of achieving both high efficiency operation and low distortion can be hardly expected. This is because even if the gate bias voltage is changed in line with the envelope 85, there is little change in peak output power. Thus, in a case where a signal having a peak amplitude as illustrated in FIG. 18 is input, it is difficult to reduce distortion of an output signal with the configuration according to the fourth comparative example.

Typically, to achieve low distortion and high efficiency operation, two methods of predistortion described in FIG. 4 and envelope tracking are used. In the envelope tracking, a voltage to be applied to the transistor is increased or decreased in accordance with an envelope of the input signal. In other words, in a case where a peak amplitude is input, the transistor is caused to operate at a high drain voltage so as to obtain high output power. Further, in a case of a low amplitude, the transistor is caused to operate at a low drain voltage so as to obtain low output power. This can increase also output power in accordance with the peak amplitude and can reduce distortion. The predistortion can compensate for distortion occurring in an operation region close to saturation and can achieve high efficiency and low distortion. Further, the envelope tracking can achieve low distortion and high efficiency in a saturation output region by causing the drain voltage to always follow the envelope.

In contrast, in the present embodiment, it is possible to easily compensate for the drain current delay with a long time constant which is difficult to be compensated for in the predistortion, including temperature characteristics. Particularly, in the present embodiment, instead of information of the whole envelope of the input signal being fed back to the gate bias voltage, a delay component of the drain current delay with a long time constant occurring as a result of a large input signal being applied to the main transistor 20 is extracted at the extraction circuit 42. By adding this delay component to the original gate bias voltage Vgg, it is possible to reduce influence of the drain current delay. In the present embodiment, it is possible to correct a delay component of several hundreds of microseconds to several milliseconds that cannot be corrected in the DPD 11. This can achieve a low instantaneous EVM for each symbol as illustrated in FIG. 11D at the same time as the spectrum waveform with low distortion as illustrated in FIG. 7 by the DPD 11. In this manner, the present embodiment effectively acts by being combined with the DPD 11. It is therefore possible to achieve high efficiency operation of the power amplifier 100.

Note that a time constant of the delay waveform that is to be extracted at the extraction circuit 42 is several hundreds of microseconds to several milliseconds, which is relatively longer than a delay period of a signal path. Thus, the phase shifter/attenuator 30 does not have to be provided.

Further, the main transistor 20 and the replica transistor 40 in the present embodiment are GaN transistors for which a drain current delay is prominently observed. The main transistor 20 and the replica transistor 40 are not limited to this and may be formed with other materials if a drain current delay is observed. For example, the main transistor 20 and the replica transistor 40 may be GaAs FETs.

Further, the main transistor 20 and the replica transistor 40 include, for example, Fe or C as an impurity that becomes a trap affecting the drain current delay. In the present embodiment, the extraction circuit 42 extracts a component having a time constant of several hundreds of microseconds to several milliseconds. As a modification of this, the extraction circuit 42 may extract a component having a time constant equal to or greater than a time constant of a trap occurring by the impurity included in the main transistor 20 or the replica transistor 40 among the output voltage of the replica transistor 40.

The extraction circuit 42 may extract a component having a time constant equal to or greater than a drain current delay among the output voltage of the replica transistor 40. Further, the extraction circuit 42 may extract a component having a time constant longer than one symbol included in the input signal.

Further, the main transistor 20 and the replica transistor 40 may be formed on the same chip. In this configuration, temperature characteristics of the main transistor 20 can be more accurately reflected on temperature characteristics of the replica transistor 40 than in a configuration in which the main transistor 20 and the replica transistor 40 are provided on different chips. This makes it possible to more accurately correct the drain current delay in accordance with a temperature. It is therefore possible to further reduce distortion components on an output spectrum by the DPD 11 and further prevent degradation of the EVM.

Further, circuits on an input side of the replica transistor 40 may be formed on one chip. In other words, the directional coupler 12, the phase shifter/attenuator 30, the envelope detector 31 and the smoother/attenuator 32 that constitute the signal generation circuit may be integrated on one chip. This chip is, for example, a GaAs chip, a GaN chip or an Si chip.

Circuits on the input side of the replica transistor 40 less depend on characteristics of the replica transistor 40 than the load circuit 41 and the extraction circuit 42 that are circuits on an output side of the replica transistor 40. Thus, circuit constants of the circuits on the input side are less likely to be adjusted after the power amplifier 100 is constituted. By integrating the circuits on the input side on a semiconductor chip, it is possible to make the circuit further smaller. Further, by mounting the circuits on the input side on a chip, variation in an amplitude and a phase by element constant variation can be reduced compared to a case where the circuits are mounted on a resin circuit substrate along with surface mount device (SMD) parts.

Further, in the present embodiment, an example where the power amplifier 100 is a single-stage amplifier has been described. The present disclosure is not limited to this, and the power amplifier 100 may be a Doherty power amplifier applied to an actual power amplifier for base station.

These modifications can be applied, as appropriate, to power amplifiers according to the following embodiments. Note that the power amplifiers according to the following embodiments are similar to those of the first embodiment in many respects, and thus differences between the power amplifiers according to the following embodiments and that of the first embodiment will be mainly described below.

Second Embodiment

Figure 20:
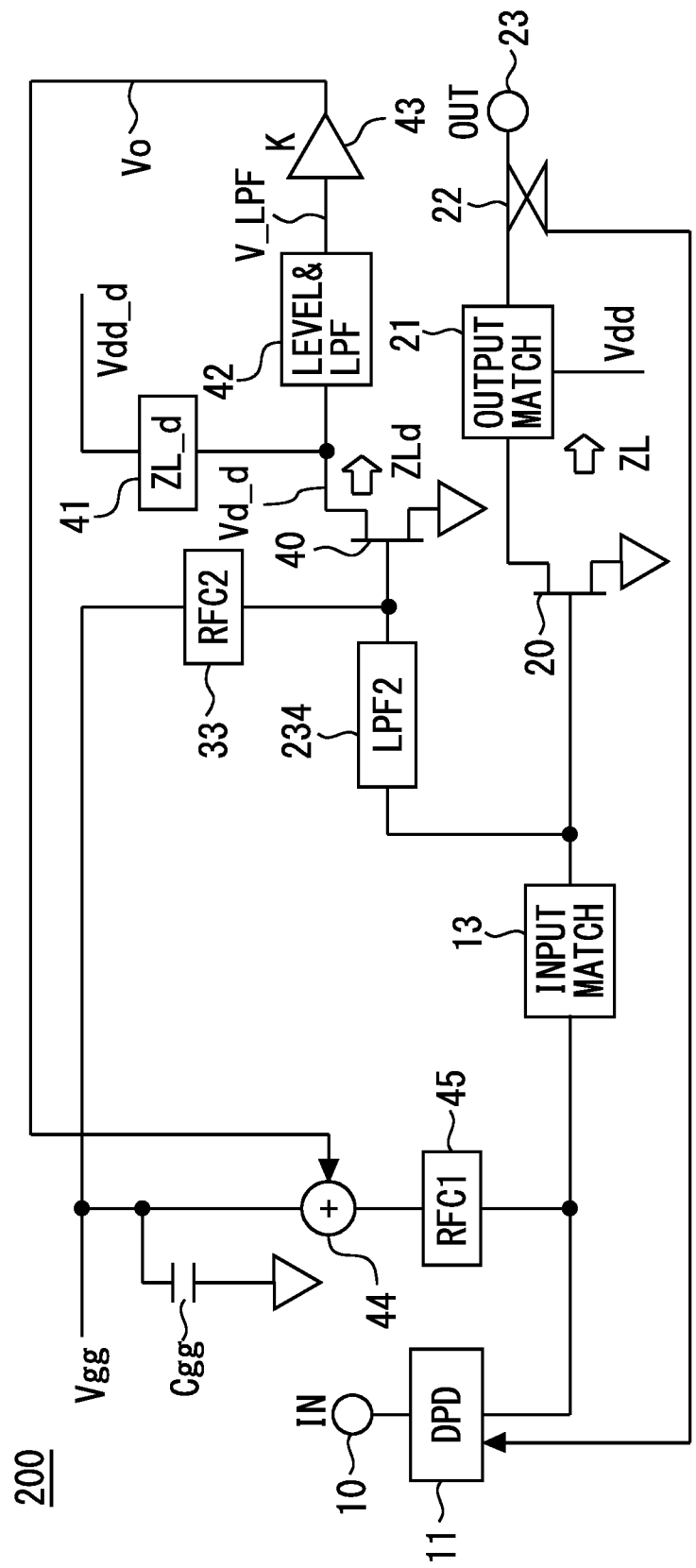
FIG. 20 is a view illustrating a circuit configuration of a power amplifier according to a second embodiment.

FIG. 20 is a view illustrating a circuit configuration of a power amplifier 200 according to a second embodiment. The present embodiment is different from the first embodiment in a configuration of a signal generation circuit that generates an envelope signal from an input signal. Other configurations are similar to the configurations in the first embodiment. The signal generation circuit is constituted with a low pass filter 234.

Figure 21:
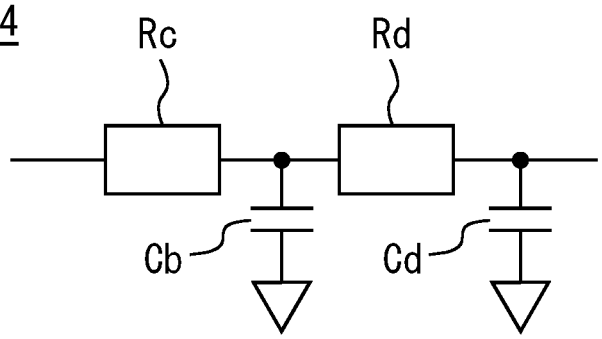
FIG. 21 is a view illustrating a circuit configuration of the signal generation circuit according to the second embodiment.

FIG. 21 is a view illustrating a circuit configuration of the signal generation circuit according to the second embodiment. The low pass filter 234 is constituted with resistors Rc and Rd, and capacitors Cb and Cd. An RF component can be reduced by appropriately setting element constants of the resistors Rc and Rd and the capacitors Cb and Cd. Thus, a low frequency component included in the input signal can be applied to the replica transistor 40.

The present embodiment is inferior to the first embodiment in accuracy of envelope extraction. In contrast, in the present embodiment, a configuration of the signal generation circuit can be simplified, and the number of parts can be reduced. It is therefore possible to make the power amplifier 200 further smaller and reduce cost.

Third Embodiment

Figure 22:
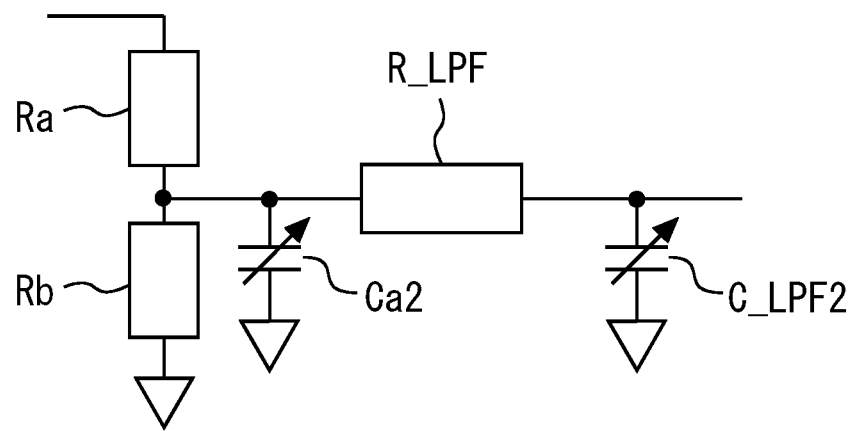
FIG. 22 is a view illustrating a circuit configuration of an extraction circuit according to a third embodiment.

FIG. 22 is a view illustrating a circuit configuration of an extraction circuit 342 according to a third embodiment. In the present embodiment, a configuration of the extraction circuit 342 is different from the configuration of the extraction circuit 42. Other configurations are similar to the configurations in the first embodiment. While the level control circuit and the low pass filter are constituted with resistor and capacitors also in the first embodiment, in the present embodiment, capacitors are variable capacitors Ca2 and C_LPF2. This makes it possible to adjust a cutoff frequency of the extraction circuit 342 and adjust a value of a time constant to be extracted. Specifically, the value of the time constant to be extracted can be changed in accordance with the time constant of the main transistor 20. In the present embodiment, an optimum extraction circuit 342 can be always set in accordance with the main transistor 20 to be used. It is therefore possible to improve a distortion compensation effect by the DPD and an effect of preventing degradation of the EVM.

Note that the technical features described in the above embodiments may be combined as appropriate.

REFERENCE SIGNS LIST 10 input terminal, 12 directional coupler, 13 input matching circuit, 20 main transistor, 21 output matching circuit, 22 directional coupler, 23 output terminal, 30 phase shifter/attenuator, 31 envelope detector, 31a operational amplifier, 31b diode, 32 smoother/attenuator, 33 RF choke circuit, 40 replica transistor, 41 load circuit, 42 extraction circuit, 43 buffer amplifier, 44 adder, 45 RF choke circuit, 60 symbol, 100 power amplifier, 200 power amplifier, 234 low pass filter, 342 extraction circuit, 801, 802, 803, 804 power amplifier, 850 gate bias compensation circuit, 850a drain current delay simulation unit, C_LPF1, C1, C10, Ca1 capacitor, Ca2 variable capacitors, Cb capacitor. R_LPF, R1, R2, R10, R12, Ra, Re resistor

The invention claimed is:

1. A power amplifier comprising:
a main transistor configured to amplify an input signal input from a gate terminal and output the amplified input signal from a drain terminal and having such characteristics of a drain current delay that, if a state of the input signal is switched from an ON state to an OFF state, after a drain current becomes lower than a reference value before the input signal is put into the ON state, the drain current returns to the reference value;
a replica transistor having the same characteristics of the drain current delay as the characteristics of the drain current delay of the main transistor, a temperature of the replica transistor changing in accordance with a temperature of the main transistor, and an envelope signal of the input signal being input to a gate terminal of the replica transistor;
an extraction circuit configured to extract a delay component due to the drain current delay from an output voltage of the replica transistor;
an adder configured to add the delay component to a gate bias voltage to be applied to the main transistor so as to cancel out the drain current delay of the main transistor; and
a signal generation circuit configured to generate the envelope signal from the input signal,
wherein the signal generation circuit is either a circuit including a directional coupler configured to branch the input signal, and an envelope detector configured to detect an envelope of the signal branched by the directional coupler, or a circuit formed with a second low pass filter.

2. The power amplifier according to claim 1, wherein the main transistor and the replica transistor are GaN transistors or GaAs FETs.

3. The power amplifier according to claim 2, wherein the main transistor and the replica transistor include Fe or C as an impurity.

4. The power amplifier according to claim 3, wherein the extraction circuit extracts a component having a time constant equal to or greater than a time constant of a trap occurring by the impurity among the output voltage of the replica transistor.

5. The power amplifier according to claim 1, wherein the extraction circuit extracts a component having a time constant equal to or greater than a time constant of the drain current delay among the output voltage of the replica transistor.

6. The power amplifier according to claim 1, wherein the extraction circuit extracts a component having a time constant of several hundreds of microseconds to several milliseconds.

7. The power amplifier according to claim 1, wherein the extraction circuit extracts a component having a time constant longer than one symbol included in the input signal.

8. The power amplifier according to claim 1, wherein the extraction circuit includes a level control circuit and a first low pass filter.

9. The power amplifier according to claim 8, wherein the level control circuit and the first low pass filter are formed with a resistors and capacitors, and the capacitors include a variable capacitor.

10. The power amplifier according to claim 1,
wherein the signal generation circuit is the circuit including the directional coupler and the envelope detector.

11. The power amplifier according to claim 1,
wherein the signal generation circuit is the circuit formed with the second low pass filter.

12. The power amplifier according to claim 1, wherein the signal generation circuit is formed on one chip.

13. The power amplifier according to claim 1, wherein the main transistor and the replica transistor are formed on the same chip.

14. The power amplifier according to claim 1, wherein the power amplifier is a Doherty power amplifier.

* * * * *